(12) United States Patent
Takagi et al.

(10) Patent No.: US 9,748,904 B2
(45) Date of Patent: Aug. 29, 2017

(54) HIGH FREQUENCY SIGNAL AMPLIFYING CIRCUITRY

(71) Applicant: Kabushiki Kaisha Toshiba, Minato-ku (JP)

(72) Inventors: Kazutaka Takagi, Kawasaki (JP); Naotaka Tomita, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/974,433

(22) Filed: Dec. 18, 2015

(65) Prior Publication Data

US 2016/0204748 A1    Jul. 14, 2016

(30) Foreign Application Priority Data

Jan. 9, 2015    (JP) .................................. 2015-003564

(51) Int. Cl.
| | |
|---|---|
| H03F 1/02 | (2006.01) |
| H03F 3/195 | (2006.01) |
| H03F 3/68 | (2006.01) |
| H03F 1/08 | (2006.01) |
| H03F 3/60 | (2006.01) |

(52) U.S. Cl.
CPC .......... H03F 1/0288 (2013.01); H03F 1/086 (2013.01); H03F 3/195 (2013.01); H03F 3/604 (2013.01); H03F 2200/153 (2013.01); H03F 2200/451 (2013.01)

(58) Field of Classification Search
USPC ............... 330/295, 124 R, 84, 286, 302, 305
See application file for complete search history.

(56) References Cited

U.S. PATENT DOCUMENTS

| | | |
|---|---|---|
| 2011/0018631 A1 | 1/2011 | Ng et al. |
| 2011/0298552 A1 | 12/2011 | Ng et al. |
| 2012/0025915 A1 | 2/2012 | Ui |
| 2012/0235734 A1 | 9/2012 | Pengelly |
| 2014/0240039 A1 | 8/2014 | Pengelly |

FOREIGN PATENT DOCUMENTS

| | | |
|---|---|---|
| EP | 2 288 020 A2 | 2/2011 |
| JP | 2001-185966 | 7/2001 |
| JP | 2012-29239 | 2/2012 |
| WO | WO 2006/006119 A1 | 1/2006 |

OTHER PUBLICATIONS

Extended European Search Report issued Jun. 2, 2016 in Patent Application No. 16150170.5.

*Primary Examiner* — Hieu Nguyen
(74) *Attorney, Agent, or Firm* — Oblon, McClelland, Maier & Neustadt, L.L.P.

(57) ABSTRACT

A high frequency signal amplifying circuitry of an embodiment includes a first splitter, a first amplifier, a second amplifier, a loop oscillation suppressor, and a combiner. The first amplifier includes a second splitter, a first carrier amplifier, a first peak amplifier, and a first combiner. The second amplifier includes a third splitter, a second carrier amplifier, a second peak amplifier, and a second combiner. The second carrier amplifier being adjacent to an associated the first carrier amplifier or the second peak amplifier being adjacent to an associated the first peak amplifier. The loop oscillation suppressor located between the second carrier amplifier and the associated first carrier amplifier or the second peak amplifier and the associated first peak amplifier.

5 Claims, 11 Drawing Sheets

HIGH FREQUENCY SIGNAL AMPLIFYING CIRCUITRY

CROSS-REFERENCE TO RELATED APPLICATION

This application is based upon and claims the benefit of priority from Japanese Patent Application No. 2015-003564, filed Jan. 9, 2015, the entire contents of which are incorporated herein by reference.

FIELD

Embodiments described herein relate generally to a high-frequency signal amplifying circuitry.

BACKGROUND

A Doherty amplifier that efficiently amplifies a backed-off high frequency signal has been known. A Doherty amplifier includes a carrier amplifier and a peak amplifier connected in parallel and combines and outputs the high frequency signals amplified by the carrier amplifier and the peak amplifier. There are cases in which a Doherty amplifier is connected in parallel with another Doherty amplifier, the same signal being divided to and amplified by the Doherty amplifier as the other Doherty amplifier. In this case, depending upon the circuit conditions, loop oscillation might occur between the Doherty amplifiers.

Figure 1:
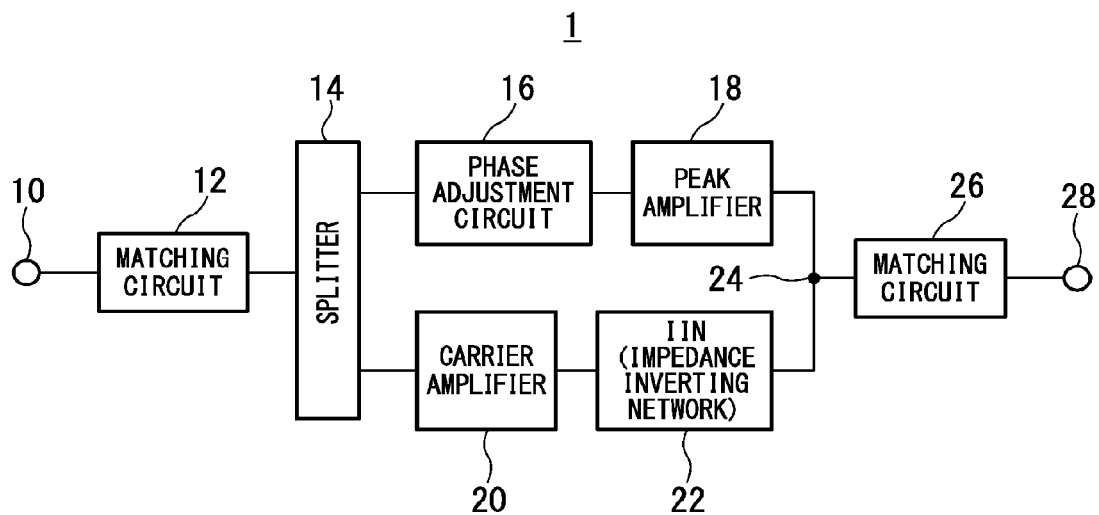
FIG. 1 is a block diagram showing the constitution of a Doherty amplifier in a high frequency signal amplifying apparatus of an embodiment.

Some embodiments are directed to a high frequency signal amplifying circuitry. The high frequency signal amplifying circuitry may include, but is not limited to, a first splitter, a first amplifier, a second amplifier, and a first loop oscillation suppressor. The first amplifier includes a second splitter that divides a signal supplied from the first splitter, a first carrier amplifier, a first peak amplifier, and a first combiner that combines signals output from the first carrier amplifier and from the first peak amplifier. The second amplifier-includes a third splitter that divides a signal supplied from the first splitter, a second carrier amplifier, a second peak amplifier, and a second combiner that combines signals output from the second carrier amplifier and from the second peak amplifier. The second carrier amplifier is adjacent to an associated the first carrier amplifier or the second peak amplifier is adjacent to an associated the first peak amplifier. The first loop oscillation suppressor locates between the second carrier amplifier and the associated first carrier amplifier or the second peak amplifier and the associated first peak amplifier. The third combiner combines signals output from the first combiner and the second combiner.

The first loop oscillation suppressor may be disposed between the second carrier amplifier and the associated first carrier amplifier or the second peak amplifier and the associated first peak amplifier. The first loop oscillation suppressor may be electrically connected between the second carrier amplifier and the associated first carrier amplifier or the second peak amplifier and the associated first peak amplifier.

In some embodiments, the first loop oscillation suppressor may connect between locations of the second carrier amplifier and the associated first carrier amplifier or the second peak amplifier and the associated first peak amplifier.

In some embodiments, the first loop oscillation suppressor connects either first and second nodes or third and fourth nodes. The first and second nodes are inputs of the first and second amplifiers, respectively. The third and fourth nodes are outputs of the first and second amplifiers, respectively.

In other words, the first and second nodes are inputs of the first and second amplifiers, respectively, and the first and second nodes are to have a first potential. In other words, the third and fourth nodes are outputs of the first and second amplifiers, respectively, and the third and fourth nodes are to have a second potential which is different from the first potential.

In some embodiments, the first loop oscillation suppressor includes a resistor.

In some embodiments, the high frequency signal amplifying circuitry may include, but is not limited to, a second loop oscillation suppressor; a third amplifier; and a fourth amplifier. The third amplifier includes a fourth splitter that divides a signal supplied from the first splitter, a third carrier amplifier, a third peak amplifier, and a fourth combiner that combines signals output from the third carrier amplifier and from the third peak amplifier. The fourth amplifier-includes a fifth splitter that divides a signal supplied from the first splitter, a fourth carrier amplifier, a fourth peak amplifier, and a fifth combiner that combines signals output from the fourth carrier amplifier and from the fourth peak amplifier. The fourth carrier amplifier is adjacent to an associated the third carrier amplifier or the fourth peak amplifier is adjacent to an associated the third peak amplifier. The third combiner combines signals output from the first combiner, the second combiner, the fourth combiner and the fifth combiner. A first pair of the first and second amplifiers is adjacent to a second pair of the third and fourth amplifiers. The second loop oscillation suppressor locates between the fourth carrier amplifier and the associated third carrier amplifier or the fourth peak amplifier and the associated third peak amplifier.

The third loop oscillation suppressor may located between the first pair of the first and second amplifiers and the second pair of the third and fourth amplifiers.

In some embodiments, at least one of the first carrier amplifier, the first peak amplifier, the second carrier amplifier, the second peak amplifier, the second splitter, the third splitter, the first combiner, the second combiner, the first splitter, the third combiner, and the first loop oscillation suppressor is in a single package.

In some embodiments, the circuitry may include, but is not limited to, a monolithic microwave integrated circuit (MMIC) on a single semiconductor substrate. The MMIC includes a part of a group consisting of: at least a part of the first carrier amplifier, at least a part of the first peak amplifier, at least a part of the second carrier amplifier, at least a part of the second peak amplifier, at least a part of the second splitter, at least a part of the third splitter, at least a part of the first combiner, at least a part of the second combiner, at least a part of the first splitter, at least a part of the third combiner, and at least a part of the first loop oscillation suppressor.

The high frequency signal amplifying apparatus of an embodiment will be described below, with references made to the drawings.

First, the Doherty amplifiers included in the high frequency signal amplifying apparatus of the embodiment will be described. FIG. 1 is a block diagram showing the constitution of a parallel-connected load type Doherty amplifier 1 in a high frequency signal amplifying apparatus of the embodiment. The Doherty amplifier 1 is inputted a high frequency signal and outputs an amplified high frequency signal to a non-illustrated antenna.

The Doherty amplifier 1 includes an input terminal 10, a matching circuit 12, a splitting unit 14, a phase adjustment circuit 16, a peak amplifier 18, a carrier amplifier 20, an IIN (impedance inverting network) 22, a combining unit 24, a matching circuit 26, and an output terminal 28.

A high frequency signal is supplied to the input terminal 10 as the input signal. A high frequency signal is a signal, for example, in the RF (radio frequency) band. The high frequency signal supplied to the input terminal 10 is sent to the matching circuit 12.

The matching circuit 12 and the matching circuit 26 match the input impedance and the output impedance of the Doherty amplifier 1. The matching circuit 12 and the matching circuit 26 include circuits that are combinations of inductors and capacitors formed on a substrate. Alternatively, the matching circuit 12 and the matching circuit 26 may be constituted by not only inductors and capacitors, but also resistors that are formed on the substrate.

The splitting unit 14 is connected to the input terminal 10 via the matching circuit 12 and divides the high frequency signal to the carrier amplifier 20 and the peak amplifier 18.

Figure 2:
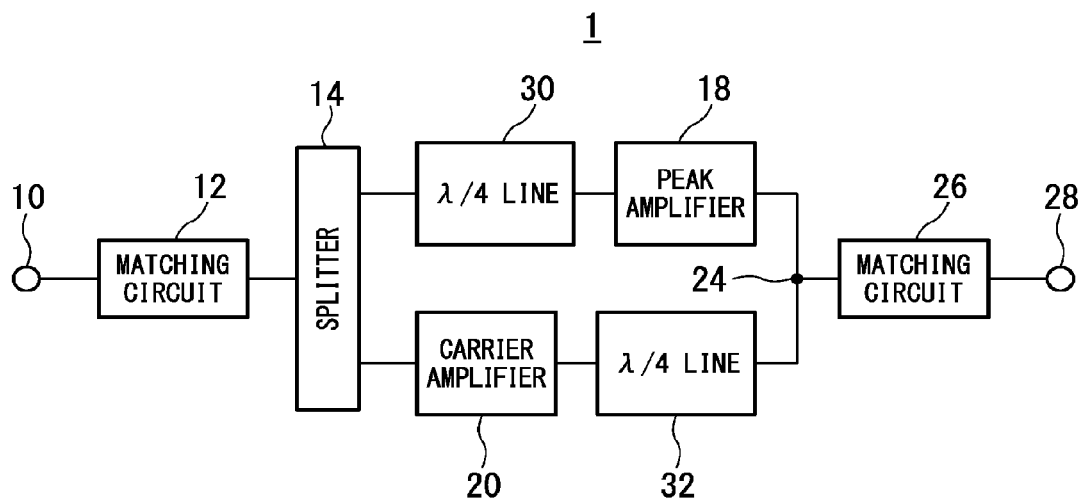
FIG. 2 is a block diagram for the case in which, in the Doherty amplifier-of the embodiment, a divided constant line is used as an example of the constitution of a phase adjustment circuit and a λ/4 line is used as an example of the constitution of an impedance inverting network (IIN).

The phase adjustment circuit 16 between the splitting unit 14 and the peak amplifier 18 adjusts the phase of the high frequency signal divided from the splitting unit 14 so that the peak amplifier 18 and the carrier amplifier 20 are in phase with each other at the splitting unit 14. FIG. 2 is a block diagram showing, in the Doherty amplifier 1 of the embodiment, the case in which a divided constant line 30 is used as an example of the constitution of the phase adjustment circuit 16. The high frequency signal that has passed through the divided constant line 30 is supplied to the peak amplifier 18. The high frequency signal that has been amplified by the peak amplifier 18 is supplied to the combining unit 24.

The IIN 22 inverts the impedance between the carrier amplifier 20 and the combining unit 24. As shown in FIG. 2, the IIN 22 includes a $\lambda/4$ line ($\frac{1}{4}$ wavelength) line 32. The $\lambda/4$ line 32 inverts the impedance and also delays the phase of the input signal by 90°. The high frequency signal that has passed through the $\lambda/4$ line 32 is supplied to the combining unit 24.

The combining unit 24 combines the high frequency signal supplied from the peak amplifier 18 and the high frequency signal supplied from the IIN 22. The high frequency signal combined by the combining unit 24 is supplied to the matching circuit 26. The high frequency signal that has passed through the matching circuit 26 is output from the output terminal 28 as the output signal.

The carrier amplifier 20 is an amplifier that uses, for example, an FET (field effect transistor) having a gate bias voltage applied thereto so that it operates as an class AB amplifier or a class B amplifier. The peak amplifier 18 is an amplifier that uses, for example. An FET (field effect transistor) having a gate bias voltage applied thereto so that it operates as a class C amplifier.

Figure 3:
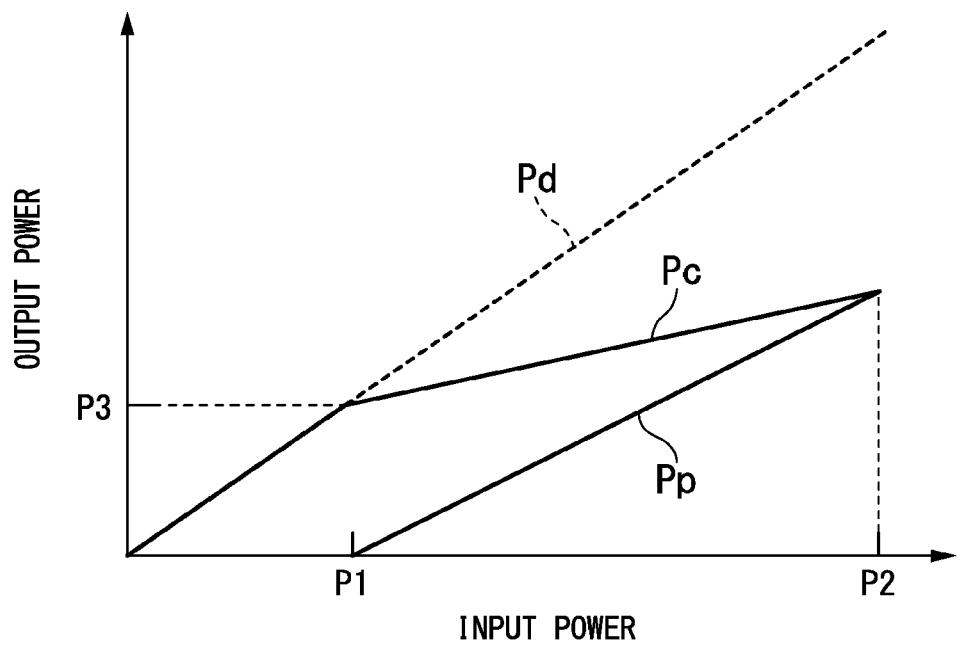
FIG. 3 shows an example of the relationship between the input power and the output power of the Doherty amplifier of the embodiment.

FIG. 3 shows an example of the relationship between the input power and the output power in the Doherty amplifier 1 of the embodiment. In the carrier amplifier 20, the gate bias voltage is set to substantially pinch it off, and amplification is done from a high frequency signal with small amplitude. When the input power to the carrier amplifier 20 is below a prescribed power P1, the carrier amplifier 20 amplifies linearly and outputs the output power Pc. When the input power to the carrier amplifier 20 approaches the prescribed power P1 and the output power Pc exceeds P3, saturation begins.

The gate bias voltage in the peak amplifier 18 is set more deeply than the carrier amplifier 20 and starts amplification operation when a high frequency signal having an amplitude (power value) exceeding a prescribed value is supplied. The peak amplifier 18 starts operating, for example, when the Doherty amplifier 1 is backed off 5 dB from the saturation power. This backoff is the ratio between the average output power and the saturation output power of the Doherty amplifier 1.

The peak amplifier 18, as shown in FIG. 3, goes into the off state when the input power is lower than the prescribed power P1. In the peak amplifier 18, when the input power exceeds the prescribed power P1, a period of time in which the gate opens occurs, and the high frequency signal is amplified. When the input power is higher than the prescribed power P1, the peak amplifier 18 can amplify the input power to the output signal Pp.

In the above-noted Doherty amplifier 1, the carrier amplifier 20 amplifies a high frequency signal of relatively small power, and is set so that when the carrier amplifier 20 voltage begins to saturate, the peak amplifier 18 goes into the on state. The peak amplifier 18 operates so as to compensate for the amount of gain lost because of saturation of the carrier amplifier 20 voltage. This enables the Doherty amplifier 1 to amplify linearly and output the output power Pd until the input power reaches P2, as shown by the dotted line in FIG. 3.

It is desirable that the peak amplifier 18 and the carrier amplifier 20 are internally matched field effect transistor amplifiers in which impedance matching is done within the package. Alternatively, the peak amplifier 18 and the carrier amplifier 20 may use discrete semiconductors as the field effect transistors. According to the Doherty amplifier 1, it is possible to achieve the optimum signal source impedance and optimum load impedance at the input electrode and the output electrode of the field effect transistor chip of the peak amplifier 18 and the carrier amplifier 20, enabling efficient amplification operation.

Also, according to the Doherty amplifier 1 of the embodiment, a constitution may be adopted in which the peak amplifier 18, the carrier amplifier 20, the splitting unit 14, the combining unit 24, the phase adjustment circuit 16, and the IIN 22 are included in a single monolithic microwave integrated circuit (MMIC).

Figure 4:
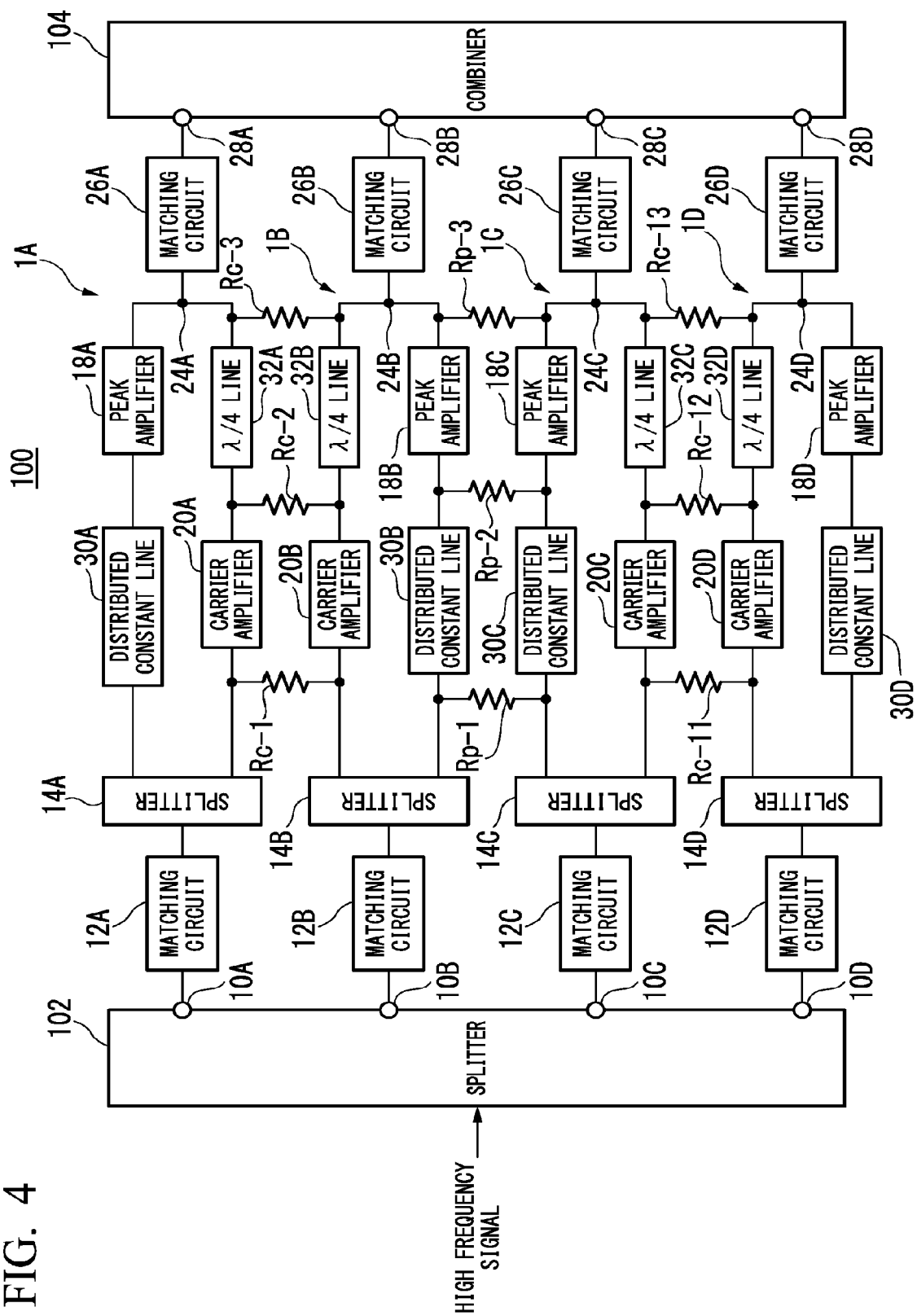
FIG. 4 is a circuit diagram showing an example of the constitution of high frequency signal amplifying apparatus of the embodiment.

A high frequency signal amplifying apparatus 100 having a plurality of the Doherty amplifier as noted above will be described, with reference made to FIG. 4. FIG. 4 is a circuit diagram showing an example of the constitution of the high frequency signal amplifying apparatus 100 of the embodiment.

The high frequency signal amplifying apparatus 100 includes a splitter 102, a plurality of Doherty amplifiers 1A, 1B, 1C, and 1D, a combiner 104, loop oscillation suppressors Rc-1, Rc-2, Rc-3, Rc-11, Rc-12, and Rc-13, and loop oscillation suppressors Rp-1, Rp-2, and Rp-3. In the high frequency signal amplifying apparatus 100, the plurality of Doherty amplifiers 1A to 1D are connected in parallel with the splitter 102 and the combiner 104. The high frequency signal amplifying apparatus 100 includes the four Doherty amplifiers 1A to 1D within a single package. In the high frequency signal amplifying apparatus 100, the splitter 102, the Doherty amplifiers 1A to 1D, and the combiner 104 are formed planarly. If no distinction is to be made between the loop oscillation suppressors Rc-1, Rc-2, Rc-3, Rc-11, Rc-12, and Rc-13 and other loop oscillation suppressors, the hyphens and the numbers that follow will be omitted, and if no distinction is to be made between the loop oscillation suppressors Rp-1, Rp-2 and Rp-3 and other loop oscillation suppressors, the hyphens and the numbers that follow will be omitted.

Although the high frequency signal amplifying apparatus 100 of the embodiment includes four Doherty amplifiers 1 that are connected in parallel, the number four is not a restriction. The number of plurality of Doherty amplifiers 1 is a number thereof that are connected in parallel in response to a power value requested by the high frequency signal amplifying apparatus 100. For example, if the output of one Doherty amplifier 1 is 50 W and the requested power is 400 W, eight Doherty amplifiers 1 may be connected in parallel, and, for example, $2^n$ (where n=1, 2, 3, . . . ) Doherty amplifiers 1 may be connected in parallel. Alternatively, an arbitrary number N (N=2, 3, 4, . . . ) Doherty amplifiers 1 may be connected in parallel.

The plurality of Doherty amplifiers 1A to 1D are disposed so that amplifiers of the same type neighbor each other. In the high frequency signal amplifying apparatus 100 shown in FIG. 4, the disposition is such that the carrier amplifier 20A of the Doherty amplifier 1A and the carrier amplifier 20B of the Doherty amplifier 1B are mutually neighboring, and such that the peak amplifier 18B of the Doherty amplifier 1B and the peak amplifier 18C of the Doherty amplifier 1C are mutually neighboring. Also, the disposition is such that the carrier amplifier 20C of the Doherty amplifier 1C and the carrier amplifier 20D of the Doherty amplifier 1D are mutually neighboring.

In the high frequency signal amplifying apparatus 100, the loop oscillation suppressors Rc-1 and Rc-2 are located between the carrier amplifier 20A and the carrier amplifier 20B. The loop oscillation suppressor Rc-1 is located between the signal input terminal of the carrier amplifier 20A and the signal input terminal of the carrier amplifier 20B. The loop oscillation suppressor Rc-2 is located between the signal output terminal of the carrier amplifier 20A and the signal output terminal of the carrier amplifier 20B. The loop oscillation suppressor Rc-3 is located between the signal output terminal of the λ/4 line 32A and the signal output terminal of the λ/4 line 32B.

The loop oscillation suppressors Rc-1 and Rc-2 may be disposed between the carrier amplifier 20A and the carrier amplifier 20B. The loop oscillation suppressors Rc-1 and Rc-2 may be electrically connected between the carrier amplifier 20A and the carrier amplifier 20B. The loop oscillation suppressor Rc-3 may be disposed between the signal output terminal of the λ/4 line 32A and the signal output terminal of the λ/4 line 32B. The loop oscillation suppressor Rc-3 may be electrically connected between the signal output terminal of the λ/4 line 32A and the signal output terminal of the λ/4 line 32B.

The loop oscillation suppressors Rp-2 and Rp-3 are located between the peak amplifier 18B and the peak amplifier 18C. The loop oscillation suppressor Rp-2 is located between the signal input terminal of the peak amplifier 18B and the signal input terminal of the peak amplifier 18C. The loop oscillation suppressor Rp-3 is located between the signal output terminal of the peak amplifier 18B and the signal output terminal of the peak amplifier 18C. The loop oscillation suppressor Rp-1 is located between the signal input terminal of the divided constant line 30B and the signal input terminal of the divided constant line 30C.

The loop oscillation suppressors Rp-2 and Rp-3 may be disposed between the peak amplifier 18B and the peak amplifier 18C. The loop oscillation suppressors Rp-2 and Rp-3 may be electrically connected between the peak amplifier 18B and the peak amplifier 18C. The loop oscillation suppressor Rp-1 may be disposed between the signal input terminal of the divided constant line 30B and the signal input terminal of the divided constant line 30C. The loop oscillation suppressor Rp-1 may be electrically connected between the signal input terminal of the divided constant line 30B and the signal input terminal of the divided constant line 30C.

The loop oscillation suppressors Rc-11 and Rc-12 are located between the carrier amplifier 20C and the carrier amplifier 20D. The loop oscillation suppressor Rc-11 is located between the signal input terminal of the carrier amplifier 20C and the signal input terminal of the carrier amplifier 20D, and the loop oscillation suppressor Rc-12 is located between the signal output terminal of the carrier amplifier 20C and the signal output terminal of the carrier amplifier 20D. The loop oscillation suppressor Rc-13 is located between the signal output terminal of the λ/4 line 32C and the signal output terminal of the λ/4 line 32D.

The loop oscillation suppressors Rc-11 and Rc-12 may be disposed between the carrier amplifier 20C and the carrier amplifier 20D. The loop oscillation suppressors Rc-11 and Rc-12 may be electrically connected between the carrier amplifier 20C and the carrier amplifier 20D. The loop oscillation suppressor Rc-13 may be disposed between the signal output terminal of the λ/4 line 32C and the signal output terminal of the λ/4 line 32D. The loop oscillation suppressor Rc-13 may be electrically connected between the signal output terminal of the λ/4 line 32C and the signal output terminal of the λ/4 line 32D.

The loop oscillation suppressor Rc-1, for example, is located between locations of the input side of the carrier amplifier 20A and the input side of the carrier amplifier 20B, which should be at the same potential, and has a resistance value. The resistance value, for example, includes a resistance value of a resistor in addition to the resistance of the interconnection (and the same applies below). The loop oscillation suppressor Rc-2 is c located between locations of the output side of the carrier amplifier 20A and the output side of the carrier amplifier 20B, which should be at the same potential, and has a resistance value. In the same manner, the loop oscillation suppressor Rc-3, the loop oscillation suppressors Rp-1, Rp-2, and Rp-3, and the loop oscillation suppressors Rc-11, Rc-12, and Rc-13 also locates interconnections that should be at the same potential and have resistance values. Although it is not illustrated, positions midway in the matching circuit 12, the divided constant line 30, the peak amplifier 18, the carrier amplifier 20, the λ/4 line 32, and the matching circuit 26 that should be at the same potential may be connected (and the same applies below). The resistance values of each of the loop oscillation suppressors may be mutually different values by optimization.

In general, loop oscillation might occur in this type of high frequency signal amplifying apparatus. Even if there is no RF input power, this oscillation phenomenon can grow from of thermal noise power, or can occur by a high power input at a specific frequency, and can affect the operation of the amplifier.

Figure 5:
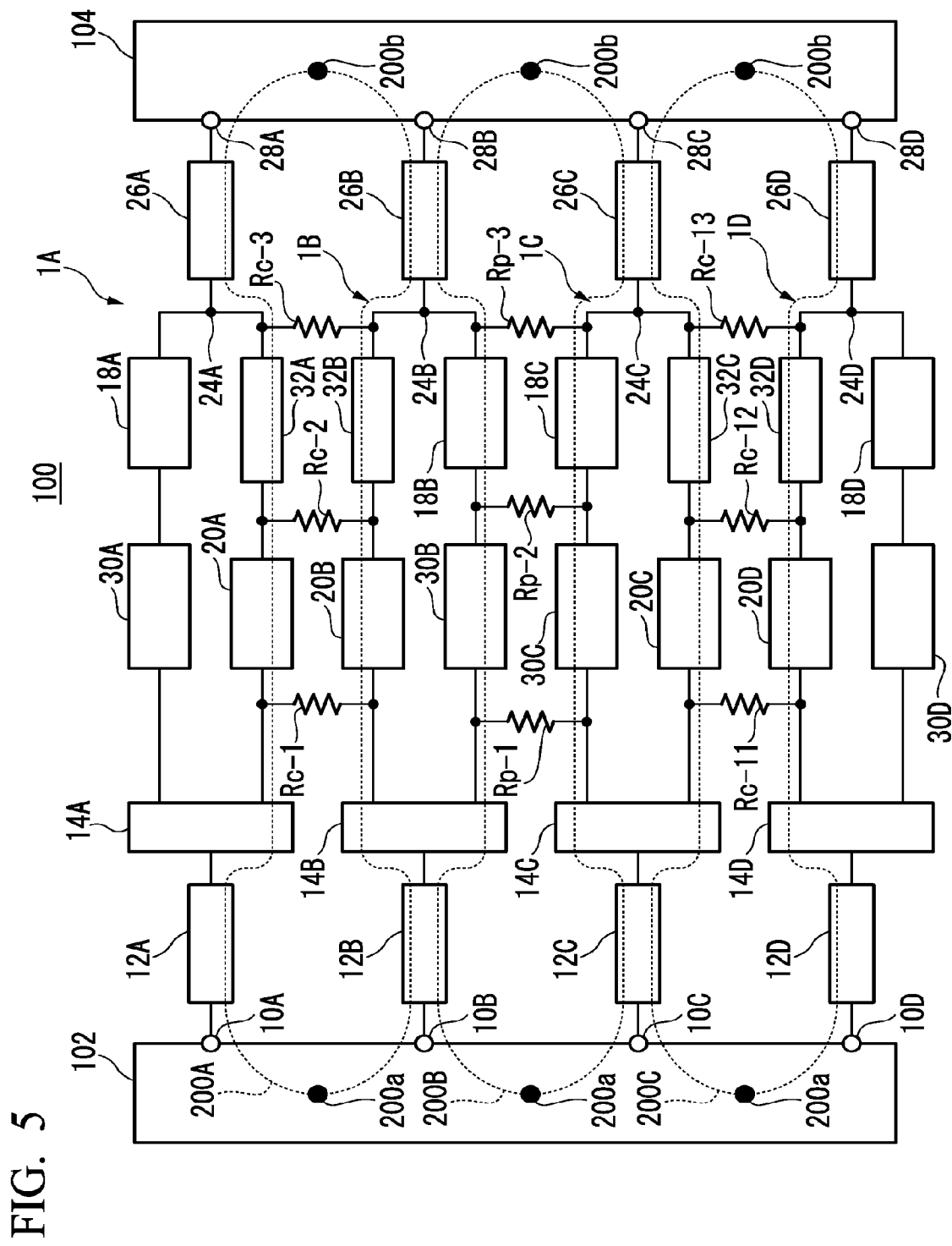
FIG. 5 is a drawing describing the loop oscillation paths in the high frequency signal amplifying apparatus of the embodiment.

FIG. 5 describes the loop oscillation paths in the high frequency signal amplifying apparatus 100 of the embodiment. As shown in FIG. 5, the high frequency signal amplifying apparatus 100 includes the loop oscillation paths 200A, 200B, and 200C when the carrier amplifiers 20 and the peak amplifiers 18 are operating. The loop oscillation paths 200A, 200B, and 200C are linked and formed by the node points 200a and 200b in the splitter 102 and the combiner 104, respectively. The loop oscillation path 200A is formed by the carrier amplifier 20A, the λ/4 line 32A, the matching circuit 26A, the combiner 104, the matching circuit 26B, the λ/4 line 32B, the carrier amplifier 20B, the splitter 14B, the matching circuit 12B, the splitter 102, the matching circuit 12A, and the splitter 14A, and by the signal lines connecting these. The loop oscillation path 200B is formed by the peak amplifier 18B, the matching circuit 26B, the combiner 104, the matching circuit 26C, the peak amplifier 18C, the divided constant line 30C, the splitter 14C, the matching circuit 12C, the splitter 102, the matching circuit 12B, and the divided constant line 30B, and by the signal lines connecting these. The loop oscillation path 200C is formed by the carrier amplifier 20C, the λ/4 line 32C, the matching circuit 26C, the combiner 104, the matching circuit 26D, the λ/4 line 32D, the carrier amplifier 20D, the splitter 14D, the matching circuit 12D, the splitter 102, the matching circuit 12C, and the splitter 14C, and by the signal lines connecting these.

Figure 6:
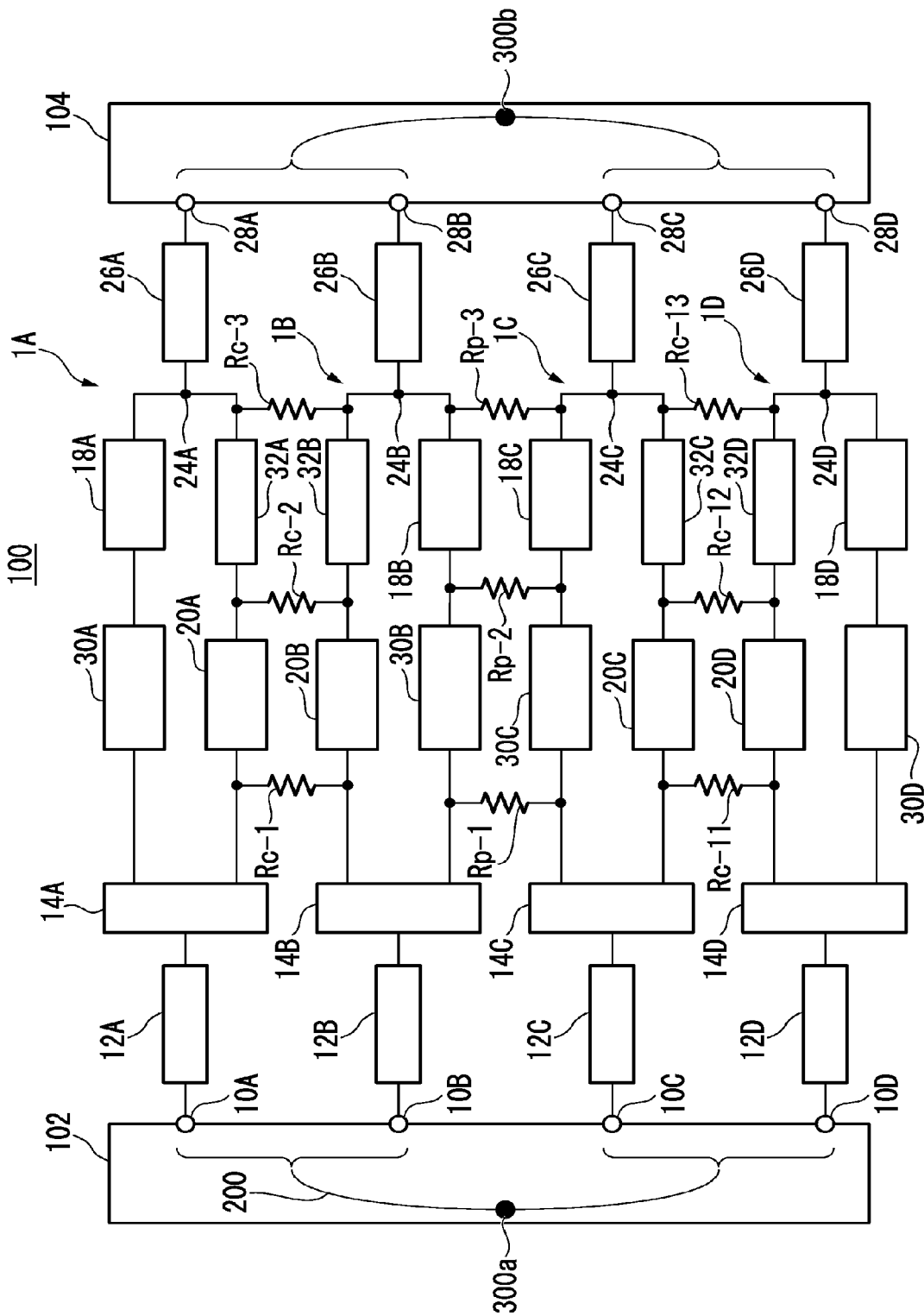
FIG. 6 is a drawing describing the loop oscillation paths in the high frequency signal amplifying apparatus of the embodiment.

FIG. 6 describes the loop oscillation paths in the high frequency signal amplifying apparatus 100 of the embodiment. As shown in FIG. 6, in the high frequency signal amplifying apparatus 100, the grouping of the path from the matching circuit 12A up to the matching circuit 26A and the path from the matching circuit 12B up to the matching circuit 26B and the grouping of the path from the matching circuit 12C up to the matching circuit 26C and the path from the matching circuit 12D up to the matching circuit 26D are joined at the node points 300a and 300b of the splitter 102 and the combiner 104, respectively, thereby forming the loop oscillation path 300.

In contrast, in the high frequency signal amplifying apparatus 100 of the embodiment, in order to suppress loop oscillation, peak amplifiers 18 or carrier amplifiers 20 are located so as to neighbor each other, and the loop oscillation suppressors Rc and Rp having resistance values are provided so as to suppress loop oscillation between the amplifiers. This enables the high frequency signal amplifying apparatus 100 to be constituted so that the conditions for loop oscillation are not satisfied, thereby suppressing the occurrence of loop oscillation between Doherty amplifiers 1. The high frequency signal amplifying apparatus 100 may be a monolithic microwave integrated circuit formed on a single substrate. The monolithic microwave integrated circuit may be housed in a package.

The loop oscillation suppressors Rc-1, Rc-2, and Rc-3 can suppress loop oscillation occurring in the loop oscillation path 200A. In the same manner, the loop oscillation suppressors Rc-11, Rc-12, and Rc-13 can suppress loop oscillation occurring in the loop oscillation path 200C. The loop oscillation suppressor Rp-1, Rp-2, and Rp-3 can suppress loop oscillation occurring in the loop oscillation path 200B when the peak amplifier 18B or the peak amplifier 18C is operating. The loop oscillation suppressor Rc-3 can suppress loop oscillation occurring in the loop oscillation path 300.

In this case, according to the high frequency signal amplifying apparatus 100 of the embodiment, because the connected amplifier are next to one another, the parasitic inductance of the loop oscillation suppressors locating between neighboring carrier amplifiers 20 or between neighboring peak amplifiers 18 can be made small. The loop oscillation suppressors are therefore substantially only resistors, enabling suppression of loop oscillation without almost no dependence on frequency. Described another way, amplifiers of the same type, which should be at the same potential, are caused to neighbor each other in order to suppress the occurrence of loop oscillation over a broad frequency band.

Figure 7:
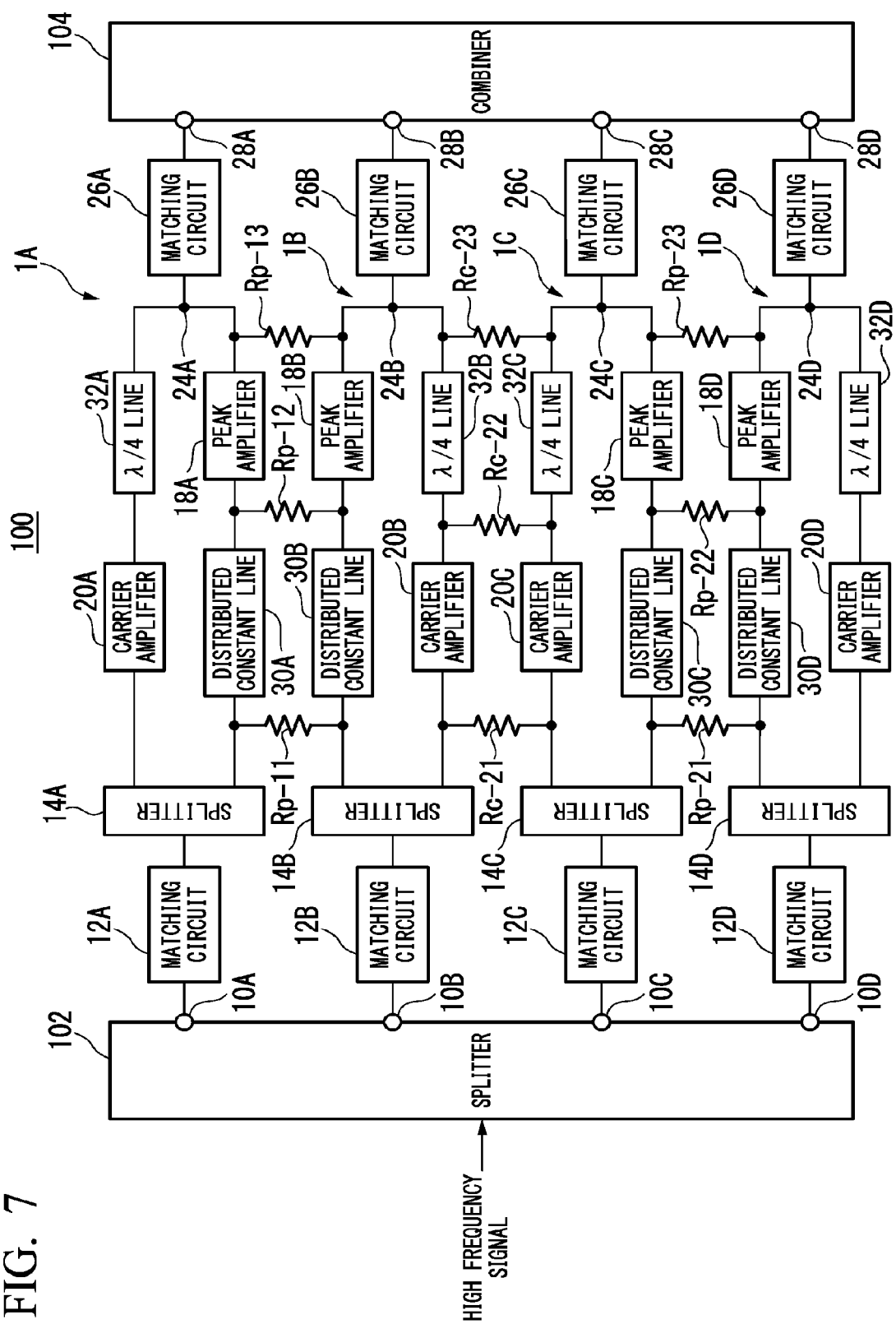
FIG. 7 is a circuit diagram showing an example of another constitution of the high frequency signal amplifying apparatus of the embodiment.

FIG. 7 is a circuit diagram showing an example of another constitution of the high frequency signal amplifying apparatus 100 of the embodiment. This high frequency signal amplifying apparatus 100 causes the peak amplifier 18A of the Doherty amplifier 1A and the peak amplifier 18B of the Doherty amplifier 1B to neighbor each other, causes the carrier amplifier 20B of the Doherty amplifier 1B and the carrier amplifier 20C of the Doherty amplifier 1C to neighbor each other, and causes the peak amplifier 18C of the Doherty amplifier 1C and the peak amplifier 18D of the Doherty amplifier 1D to neighbor each other.

In this high frequency signal amplifying apparatus 100, loop oscillation suppressors Rp-11, Rp-12, and Rp-13 are located between the peak amplifier 18A and the peak amplifier 18B, loop oscillation suppressors Rc-21, Rc-22, and Rc-23 are located between the carrier amplifier 20B and the carrier amplifier 20C, and loop oscillation suppressors Rp-21, Rp-22, and Rp-23 are located between the peak amplifier 18C and the peak amplifier 18D.

The loop oscillation suppressors Rp-11, Rp-12, and Rp-13 may be disposed between the peak amplifier 18A and the peak amplifier 18B. The loop oscillation suppressors Rp-11, Rp-12, and Rp-13 may be electrically connected between the peak amplifier 18A and the peak amplifier 18B.

The loop oscillation suppressors Rc-21, Rc-22, and Rc-23 may be disposed between the carrier amplifier 20B and the carrier amplifier 20C. The loop oscillation suppressors Rc-21, Rc-22, and Rc-23 may be electrically connected between the carrier amplifier 20B and the carrier amplifier 20C.

The loop oscillation suppressors Rp-21, Rp-22, and Rp-23 may be disposed between the peak amplifier 18C and the peak amplifier 18D. The loop oscillation suppressors Rp-21, Rp-22, and Rp-23 may be electrically connected between the peak amplifier 18C and the peak amplifier 18D.

Figure 8:
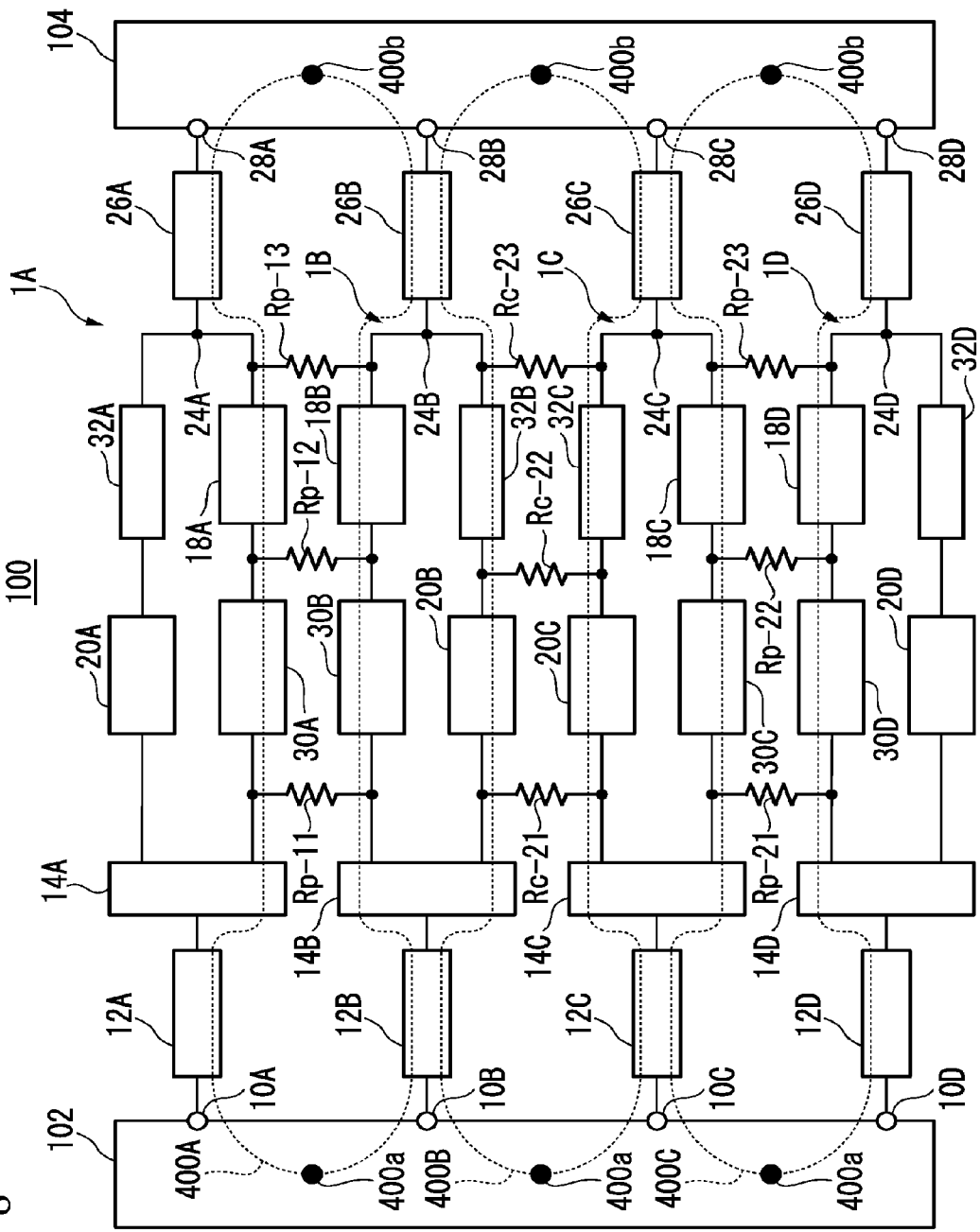
FIG. 8 is drawing describing the loop oscillation paths in the high frequency signal amplifying apparatus of the embodiment.

FIG. 8 describes the loop oscillation paths in the high frequency signal amplifying apparatus 100 of the embodiment. As shown in FIG. 8, the high frequency signal amplifying apparatus 100 includes the loop oscillation paths 400A, 400B, and 400C when the peak amplifiers 18 and the carrier amplifiers 20 are operating. The loop oscillation paths 400A, 400B, and 400C are formed by joining at the node points 400a and 400b in the splitter 102 and the combiner 104, respectively. The loop oscillation path 400A is formed by the peak amplifier 18A, the matching circuit 26A, the combiner 104, the matching circuit 26B, the peak amplifier 18B, the divided constant line 30B, the splitter 14B, the matching circuit 12B, the splitter 102, the matching circuit 12A, the splitter 14A, and the divided constant line 30A, and by the signal lines that connect these. The loop oscillation path 400B is formed by the carrier amplifier 20B, the λ/4 line 32B, the matching circuit 26B, the combiner 104, the matching circuit 26C, the λ/4 line 32C, the carrier amplifier 20C, the splitter 14C, the matching circuit 12C, the splitter 102, and the matching circuit 12B, and by the splitter 14B, and by the signal lines that connect these. The loop oscillation path 400C is formed by the peak amplifier 18C, the matching circuit 26C, the combiner 104, the matching circuit 26D, the peak amplifier 18D, the divided constant line 30D, the splitter 14D, the matching circuit 12D, the splitter 102, the matching circuit 12C, the splitter 14C, and the divided constant line 30C, and by the signal lines that connect these.

Figure 9:
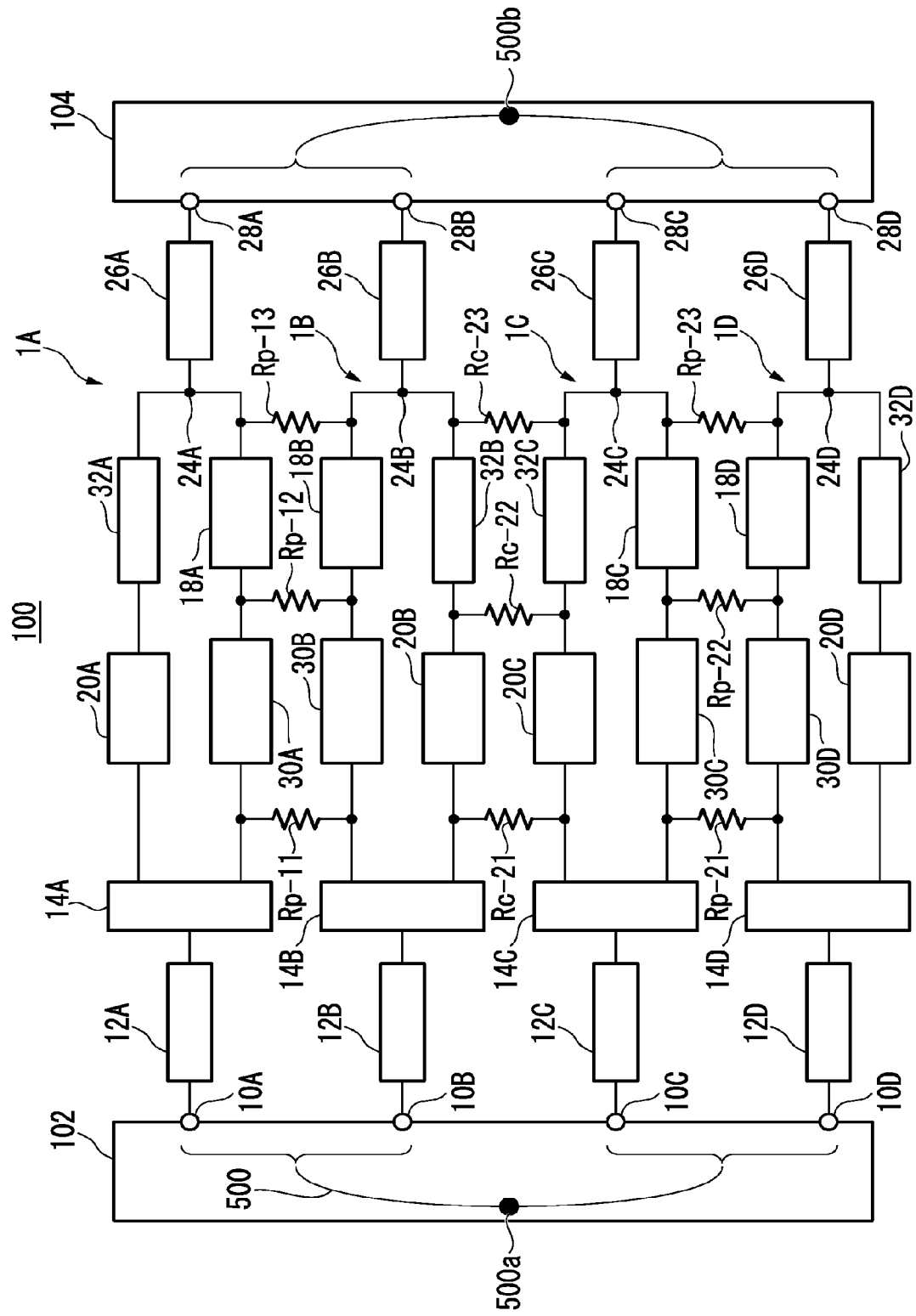
FIG. 9 is drawing describing the loop oscillation paths in the high frequency signal amplifying apparatus of the embodiment.

FIG. 9 describes the loop oscillation paths in the high frequency signal amplifying apparatus 100 of the embodiment. In the high frequency signal amplifying apparatus 100, as shown in FIG. 9, the grouping of the path from the matching circuit 12A up to the matching circuit 26A and the path from the matching circuit 12B up to the matching circuit 26B and the grouping of the path from the matching circuit 12C up to the matching circuit 26C and the path from the matching circuit 12D up to the matching circuit 26D are joined at the node points 500a and 500b, of the splitter 102 and the combiner 104, respectively, thereby forming the loop oscillation path 500.

By the above-noted constitution, the loop oscillation suppressors Rp-11, Rp-12, and Rp-13 can suppress loop oscillation occurring in the loop oscillation path 400A. In the same manner, the loop oscillation suppressors Rp-21, Rp-22, and Rr-23 can suppress loop oscillation occurring in the loop oscillation path 400C, the loop oscillation suppressors Rc-21, Rc-22, and Rc-23 can suppress loop oscillation occurring in the loop oscillation path 400B, and the loop oscillation suppressor Rc-23 can suppress loop oscillation occurring in the loop oscillation path 500.

The high frequency signal amplifying apparatus 100 of the embodiment described above enables a constitution in which the peak amplifiers 18 of the plurality of respective Doherty amplifiers 1 or the carrier amplifiers 20 of the plurality of respective Doherty amplifiers 1 are caused to be mutually neighboring, because there are loop oscillation suppressors located between the neighboring peak amplifiers 18 or the carrier amplifiers 20, the conditions for loop oscillations are not satisfied. As a result, the embodiment enables suppression of loop oscillation between the plurality of Doherty amplifiers 1.

According to the high frequency signal amplifying apparatus 100 of the embodiment, a constitution can be adopted in which, when loop oscillation tends to occur between the carrier amplifiers 20, which operate for a longer period of time than do the peak amplifiers 18, the carrier amplifiers 20 are disposed as to be neighboring, such as shown in FIG. 4, and, conversely, when loop oscillation tends to occur between the peak amplifiers 18, the peak amplifiers 18, which have high non-linearity, are disposed so as to be neighboring, such as shown in FIG. 7, thereby enabling avoiding satisfying the condition of the respective loop oscillations.

MODIFICATIONS TO EMBODIMENT

Figure 10:
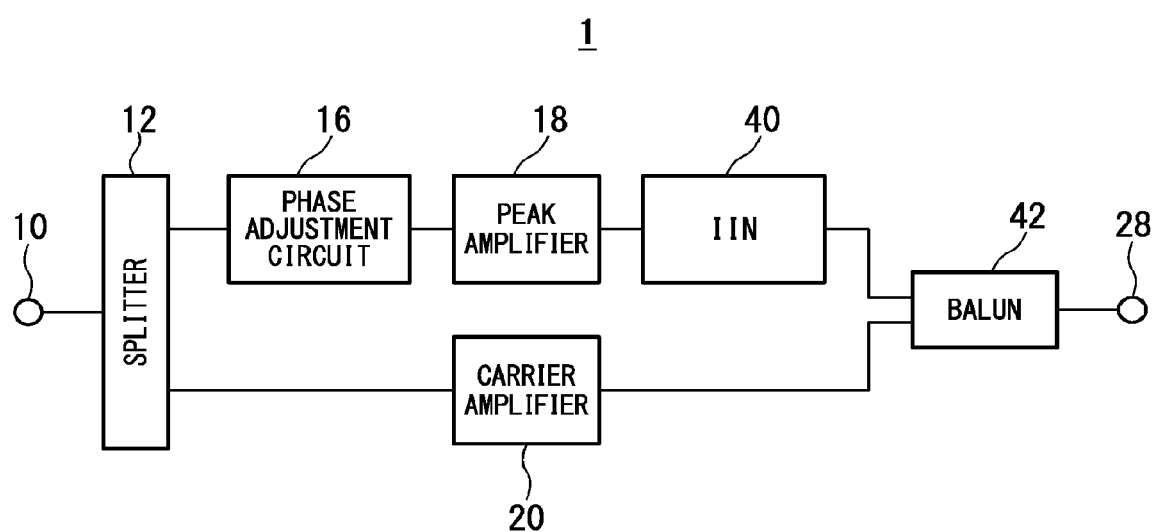
FIG. 10 is a block diagram showing the constitution of a variation example of the Doherty amplifier 1 in the high frequency signal amplifying apparatus of the embodiment.

FIG. 10 is a block diagram showing the constitution of a variation example of the Doherty amplifier 1 in the high frequency signal amplifying apparatus 100 of the embodiment, this block diagram showing a series-connected load type Doherty amplifier 1. The Doherty amplifier 1, as shown in FIG. 10, includes an IIN (impedance inverting network) 40 and a balun 42. The balun 42 is a converter that converts a high frequency signal between the balanced line and an unbalanced line and is, for example, a converter, one end of which is connected to the IIN 40 and the carrier amplifier 20, and the other end of which is connected to the output terminal 28.

Even in the case of such a series-connected load type Doherty amplifier 1, in the high frequency signal amplifying apparatus 100, as described above, respective peak amplifiers 18 of the plurality of neighboring Doherty amplifiers 1 are caused to be neighboring or respective carrier amplifiers 20 of the neighboring Doherty amplifiers 1 are cause to be neighboring, and loop oscillation suppressors are provided between neighboring peak amplifiers 18 or carrier amplifiers 20. This enables the high frequency signal amplifying apparatus 100, similar to the above-described high frequency signal amplifying apparatus 100, to suppress loop oscillation between a plurality of Doherty amplifiers 1.

Example of Application

Figure 11:
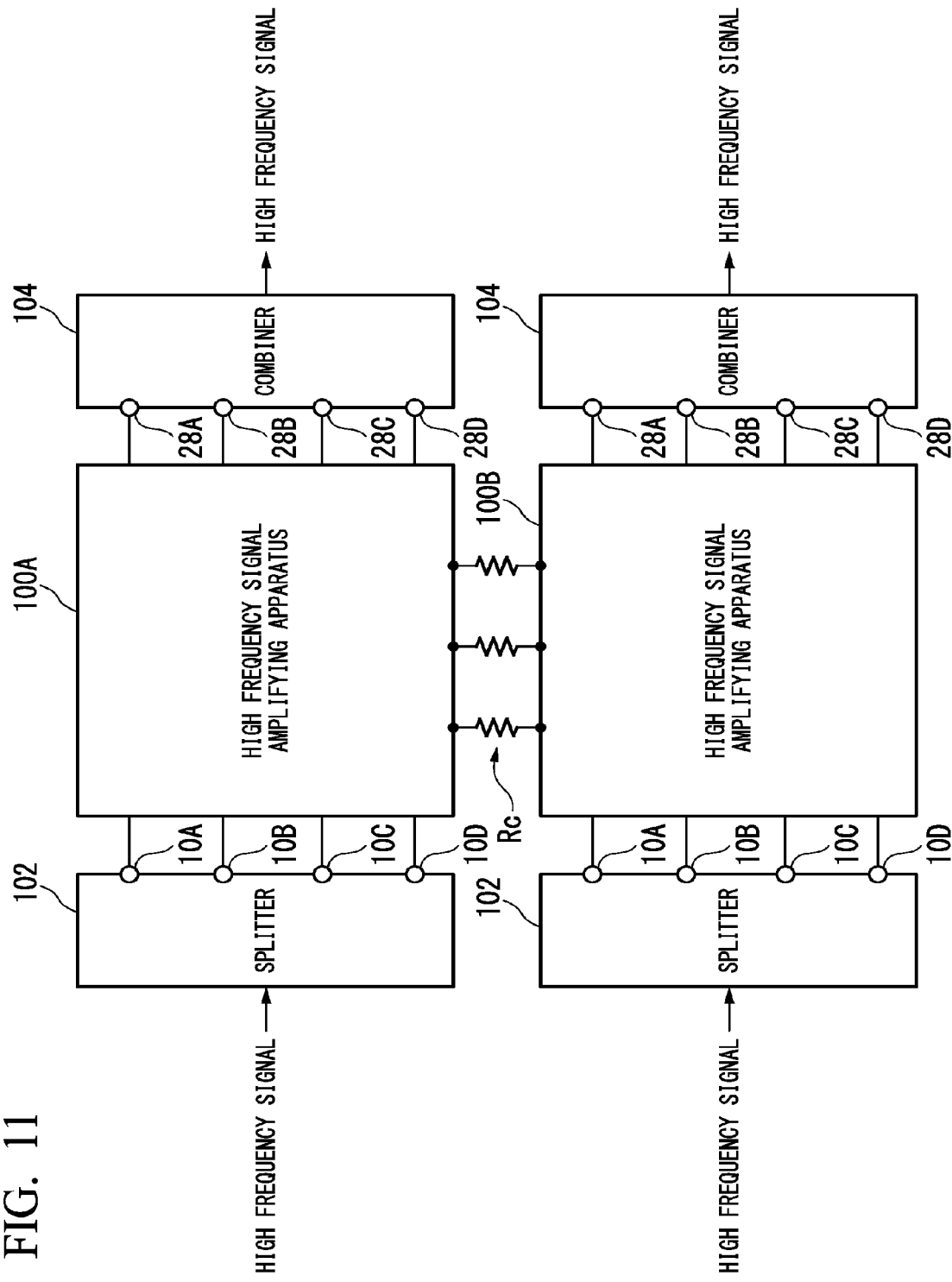
FIG. 11 is a block diagram showing the constitution of an application example of the high frequency signal amplifying apparatus of the embodiment.

FIG. 11 is a block diagram showing the constitution of an application example of the high frequency signal amplifying apparatus 100 of the embodiment. The high frequency signal amplifying apparatus of the application example includes a high frequency signal amplifying apparatus 100A and a high frequency signal amplifying apparatus 100B, which include the same constitution as the above-described high frequency signal amplifying apparatus 100, disposed in parallel, with loop oscillation suppressors Rc located between the high frequency signal amplifying apparatus 100A and the high frequency signal amplifying apparatus 100B.

The loop oscillation suppressors Rc may be disposed between the high frequency signal amplifying apparatus 100A and the high frequency signal amplifying apparatus 100B. The loop oscillation suppressors Rc may be electrically connected between the high frequency signal amplifying apparatus 100A and the high frequency signal amplifying apparatus 100B.

The high frequency signal amplifying apparatus 100A and the high frequency signal amplifying apparatus 100B may be a monolithic microwave integrated circuit formed on a single substrate. The monolithic microwave integrated circuit may be housed in a package.

In the application example, the amplifiers included in the high frequency signal amplifying apparatus 100A and the amplifiers included in the high frequency signal amplifying apparatus 100B are disposed so that amplifiers of the same type neighbor each other. Also, the loop oscillation suppressors Rc locate, for example, the input side of the carrier amplifiers 20A with the input side of the carrier amplifiers 20B, which should be at the same potential, and have a resistance value. The loop oscillation suppressors Rc also locate, for example, the output side of the carrier amplifiers 20A with the output side of the carrier amplifiers 20B, which should be at the same potential, and have a resistance value.

According to the high frequency signal amplifying apparatus of the application example, even if a plurality of high frequency signal amplifying apparatuses 100 are disposed in parallel, because loop oscillation suppressors Rc are located between the high frequency signal amplifying apparatuses 100, it is possible to avoid satisfying the conditions for loop oscillation between the high frequency signal amplifying apparatuses 100 being satisfied. As a result, the embodiment enables the suppression of the occurrence of loop oscillation in the high frequency signal amplifying apparatus 100.

Comparative Example

Figure 12:
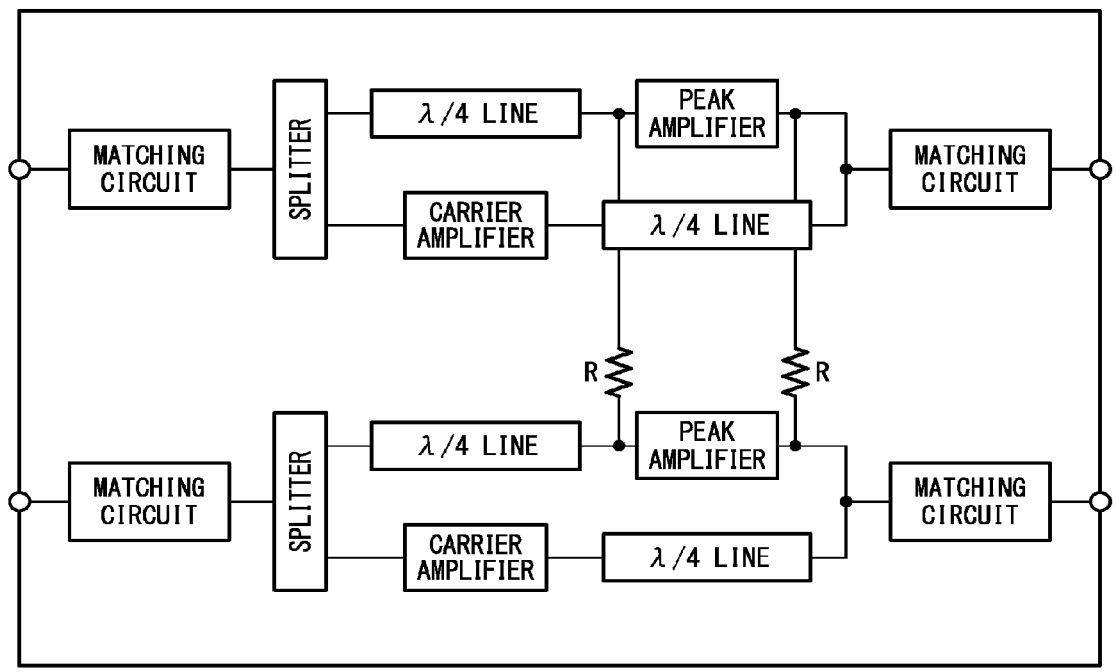
FIG. 12 is a drawing showing a high frequency signal amplifying apparatus of a comparison example.

A high frequency signal amplifying apparatus 100 of a comparison example will be described below. FIG. 12 is a circuit diagram of a high frequency signal amplifying apparatus of the comparison example. The high frequency signal amplifying apparatus of the comparison example disposes two Doherty amplifiers so that peak amplifiers are not neighboring each other and so that carrier amplifiers are not neighboring each other. In the high frequency signal amplifying apparatus of the comparison example, in order to suppress loop oscillation occurring in the two Doherty amplifiers, if resistors R are connected between the input terminals of the peak amplifiers and between the output terminals of the peak amplifiers, it is necessary to form interconnections that straddle across a $\lambda/4$ line. For this reason, in the high frequency signal amplifying apparatus of the comparison example, the required length of the lines for providing the resistors R become long, and there is a possibility that the inductance of the lines increases. In the high frequency signal amplifying apparatus of the comparison example, therefore, even if the resistors R are provided, there is a possibility that the effect of suppressing loop oscillation will be reduced, relative to the high frequency signal amplifying apparatus 100 of the embodiment.

According to at least one embodiment described above, by having a loop oscillation suppressor locating between neighboring carrier amplifiers 20 or between neighboring peak amplifiers 18, it is possible to suppress loop oscillation between the plurality of Doherty amplifiers 1.

Although the high frequency signal amplifying apparatus 100 of the embodiments described above has been described with regard to a constitution in which a plurality of parallel-connected Doherty amplifiers 1 are disposed, the constitution disclosed in the embodiment can also be applied to a constitution in which a plurality of series-connected Doherty amplifiers 1 are disposed. That is, in addition to disposing a plurality of Doherty amplifiers 1 in series, amplifiers of the same type are caused to neighbor each other. In a series-connected type Doherty amplifier 1, loop oscillation suppressors Rc are located between neighboring amplifiers of the same type. These loop oscillation suppressors Rc are located so as to connect locations in amplifiers of the same type that should be at the same potential. As a result, the high frequency signal amplifying apparatus 100 of the embodiment can suppress the occurrence of loop oscillation even if the Doherty amplifiers 1 are of the series-connected type.

While certain embodiments of the present invention have been described, these embodiments have been presented by way of example only, and are not intended to limit the scope of the inventions. Indeed, the novel embodiments described herein may be embodied in a variety of other forms, and various omissions, substitutions and changes in the form of the embodiments described herein may be made without departing from the spirit of the inventions. The accompanying claims and there equivalents are intended to cover such forms or modifications as would fall within the scope and spirit of the invention.

What is claimed is:

1. A high frequency signal amplifying circuitry comprising:
   a first splitter;
   a first amplifier including a second splitter that divides a signal supplied from the first splitter, a first carrier amplifier, a first peak amplifier, and a first combiner that combines signals output from the first carrier amplifier and from the first peak amplifier;
   a second amplifier including a third splitter that divides a signal supplied from the first splitter, a second carrier amplifier, a second peak amplifier, and a second combiner that combines signals output from the second carrier amplifier and from the second peak amplifier;
   a first loop oscillation suppressor; and
   a third combiner that combines signals output from the first combiner and the second combiner, wherein
   the first loop oscillation suppressor is located between the second carrier amplifier and the first carrier amplifier or the second peak amplifier and the first peak amplifier,
   the second carrier amplifier is adjacent to the first carrier amplifier or the second peak amplifier is adjacent to the first peak amplifier, and
   the first loop oscillation suppressor includes a first resistor that connects between locations, which should be at the same potential, of the second carrier amplifier and the first carrier amplifier or the second peak amplifier and the first peak amplifier.

2. The high frequency signal amplifying circuitry according to claim 1, further comprising:
   a third loop oscillation suppressor;
   a third amplifier including a fourth splitter that divides a signal supplied from the first splitter, a third carrier amplifier, a third peak amplifier, and a fourth combiner that combines signals output from the third carrier amplifier and from the third peak amplifier;
   a fourth amplifier including a fifth splitter that divides a signal supplied from the first splitter, a fourth carrier amplifier, a fourth peak amplifier, and a fifth combiner that combines signals output from the fourth carrier amplifier and from the fourth peak amplifier, the fourth carrier amplifier being adjacent to the third carrier amplifier or the fourth peak amplifier being adjacent to the third peak amplifier; and
   a second loop oscillation suppressor that includes a second resistor that connects between locations, which should be at the same potential, of the fourth carrier amplifier and the third carrier amplifier or the fourth peak amplifier and the third peak amplifier, wherein
   the third combiner combines signals output from the first combiner, the second combiner, the fourth combiner, and the fifth combiner,
   a first pair of the first and second amplifiers is adjacent to a second pair of the third and fourth amplifiers, and
   the third loop oscillation suppressor is located between the first pair of the first and second amplifiers and the second pair of the third and fourth amplifiers.

3. The high frequency signal amplifying circuitry according to claim 1, wherein at least one of the first carrier amplifier, the first peak amplifier, the second carrier amplifier, the second peak amplifier, the second splitter, the third splitter, the first combiner, the second combiner, the first splitter, the third combiner, and the first loop oscillation suppressor is in a single package.

4. The high frequency signal amplifying circuitry according to claim 1, wherein
the circuitry is a monolithic microwave integrated circuit (MMIC) on a single semiconductor substrate, and
the MMIC includes a part of a group consisting of: at least a part of the first carrier amplifier, at least a part of the first peak amplifier, at least a part of the second carrier amplifier, at least a part of the second peak amplifier, at least a part of the second splitter, at least a part of the third splitter, at least a part of the first combiner, at least a part of the second combiner, at least a part of the first splitter, at least a part of the third combiner, and at least a part of the first loop oscillation suppressor.

5. The high frequency signal amplifying circuitry system comprising:
a plurality of high frequency signal amplifying circuitry according to claim 1 connected in parallel; and
a loop oscillation suppressor, wherein
at edge parts in which the plurality of high frequency signal amplifying circuitry are mutually opposed, amplifiers of the same type are disposed, and
the loop oscillation suppressor includes a fourth resistor that connects between locations, which should be at the same potential, of the amplifiers of the same type.

* * * * *